United States Patent
Gohira et al.

(10) Patent No.: US 11,251,049 B2
(45) Date of Patent: Feb. 15, 2022

(54) ETCHING METHOD AND PLASMA PROCESSING APPARATUS

(71) Applicant: Tokyo Electron Limited, Tokyo (JP)

(72) Inventors: Taku Gohira, Miyagi (JP); Masahiro Tadokoro, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/840,585

(22) Filed: Apr. 6, 2020

(65) Prior Publication Data
US 2020/0321219 A1     Oct. 8, 2020

(30) Foreign Application Priority Data
Apr. 8, 2019  (JP) .............................. JP2019-073395

(51) Int. Cl.
| | | |
|---|---|---|
| H01L 21/311 | (2006.01) | |
| H01J 37/32 | (2006.01) | |
| H01L 21/67 | (2006.01) | |
| H01L 27/11582 | (2017.01) | |
| H01L 27/11556 | (2017.01) | |

(52) U.S. Cl.
CPC .... *H01L 21/31116* (2013.01); *H01J 37/3244* (2013.01); *H01J 37/32724* (2013.01); *H01L 21/31144* (2013.01); *H01L 21/67069* (2013.01); *H01J 2237/24585* (2013.01); *H01J 2237/334* (2013.01); *H01L 21/67248* (2013.01); *H01L 27/11556* (2013.01); *H01L 27/11582* (2013.01)

(58) Field of Classification Search
None
See application file for complete search history.

(56) References Cited

U.S. PATENT DOCUMENTS

2018/0204728 A1*  7/2018  Oomori .................. H01L 21/31

FOREIGN PATENT DOCUMENTS

| | | |
|---|---|---|
| JP | 2016-192483 A | 11/2016 |
| JP | 2016-207840 A | 12/2016 |
| JP | 2016-225437 A | 12/2016 |

* cited by examiner

Primary Examiner — Roberts P Culbert
(74) Attorney, Agent, or Firm — Pearne & Gordon LLP (57) ABSTRACT

In an etching method, a target object temperature is maintained within a range from −30° C. to 30° C. When a flow rate of an $i^{th}$ fluorocarbon gas in one or multiple fluorocarbon gases is referred to as J(i); a number of fluorine atoms and a number of carbon atoms in the corresponding gas are referred to as M(i) and N(i), respectively; a value calculated by summing $J(i) \times N(i)/M(i)$ of all values that i can be is referred to as Ua; a flow rate of a $k^{th}$ hydrogen-containing gas in one or multiple hydrogen-containing gases is referred to as J(k); a number of hydrogen atoms in the corresponding gas is referred to as H(k); and a value calculated by summing $J(k) \times H(k)$ of all values that k can be is referred to as Ub, Ua/Ub satisfies a condition of $0.04 < Ua/Ub < 0.22$.

11 Claims, 7 Drawing Sheets

ETCHING METHOD AND PLASMA PROCESSING APPARATUS

CROSS-REFERENCE TO RELATED APPLICATION

This application claims the benefit of Japanese Patent Application No. 2019-073395 filed on Apr. 8, 2019, the entire disclosure of which is incorporated herein by reference.

TECHNICAL FIELD

The various aspects and embodiments described herein pertain generally to an etching method and a plasma processing apparatus.

BACKGROUND

In the manufacture of a NAND type flash memory device having a three dimensional structure, etching of a multilayered film including a silicon oxide film and a silicon nitride film may be performed. For example, an etching method described in Patent Document 1 includes a first process and a second process. In the first process, plasma from a first processing gas including a fluorocarbon gas and a hydrofluorocarbon gas is formed within a processing vessel of a plasma processing apparatus in which a processing target object is placed. In the second process, plasma from a second processing gas including a hydrogen gas, a hydrofluorocarbon gas and a nitrogen gas is formed within the processing vessel of the plasma processing apparatus. In this method, the first process and the second process are repeated alternately.

An etching method described in Patent Document 2 includes a first plasma processing process and a second plasma processing process. In the first plasma processing process, plasma from a first processing gas including a fluorocarbon gas and an oxygen gas is formed in a processing vessel of a plasma processing apparatus. In the second plasma processing process, plasma from a second processing gas including a hydrogen gas, a nitrogen trifluoride gas, a hydrogen bromide gas and a carbon-containing gas is formed in the processing vessel. In the first plasma processing process, a temperature of an electrostatic chuck is set to a first temperature. In the second plasma processing process, the temperature of the electrostatic chuck is set to a second temperature which is lower than the first temperature.

Further, Patent Document 3 discloses an etching processing method. In this method, plasma is formed from a hydrogen-containing gas and a fluorine-containing gas by a high frequency power for plasma formation, and etching target films including a silicon oxide film and a silicon nitride film are etched by the formed plasma in an extremely low-temperature environment equal to or less than −30° C. In this etching, a difference between an etching rate of a first etching of etching one etching target film and an etching rate of a second etching of etching another etching target film having a structure different from that of the one etching target film is regulated to be within ±20%.

Patent Document 1: Japanese Patent Laid-open Publication No. 2016-192483
Patent Document 2: Japanese Patent Laid-open Publication No. 2016-225437
Patent Document 3: Japanese Patent Laid-open Publication No. 2016-207840

SUMMARY

In one exemplary embodiment, there is provided an etching method of etching a processing target object. The etching method includes placing the processing target object on a placing table provided within a processing vessel of a plasma processing apparatus; performing a setting of maintaining a temperature of the processing target object within a predetermined temperature range; and forming plasma from a processing gas within the processing vessel and performing an etching processing upon the processing target object by using the plasma, while maintaining the temperature of the processing target object within the predetermined temperature range. The processing target object includes a silicon oxide film and a silicon nitride film. The processing gas includes a first gas and a second gas. The first gas is a fluorocarbon gas. The second gas is a hydrogen-containing gas. The predetermined temperature range is equal to or higher than −30° C. and equal to or less than 30° C. The first gas includes a first fluorocarbon gas to a $p^{th}$ fluorocarbon gas of p kinds of fluorocarbon gases (p is an integer equal to or larger than 1). The second gas includes a first hydrogen-containing gas to a $q^{th}$ hydrogen-containing gas of q kinds of hydrogen-containing gases (q is an integer equal to or larger than 1). A flow rate of an $i^{th}$ fluorocarbon gas, which is included in the first fluorocarbon gas to the $p^{th}$ fluorocarbon gas, during the etching processing is referred to as J(i). A number of fluorine atoms included in an elemental composition of the $i^{th}$ fluorocarbon gas is referred to as M(i). A number of carbon atoms included in the elemental composition of the $i^{th}$ fluorocarbon gas is referred to as N(i). A value calculated by summing J(i)×N(i)/M(i) of all values that i can be is referred to as Ua (i is an integer equal to or larger than 1 and equal to or less than p). A flow rate of a $k^{th}$ hydrogen-containing gas, which is included in the first hydrogen-containing gas to the $q^{th}$ hydrogen-containing gas, during the etching processing is referred to as J(k). A number of hydrogen atoms included in an elemental composition of the $k^{th}$ hydrogen-containing gas is referred to as H(k). A value calculated by summing J(k)×H(k) of all values that k can be is referred to as Ub (k is an integer equal to or larger than 1 and equal to or less than q). Ua/Ub satisfies a condition of 0.04<Ua/Ub<0.22.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described. In one exemplary embodiment, an etching method of etching a processing target object is provided. The etching method includes placing the processing target object on a placing table provided within a processing vessel of a plasma processing apparatus; performing a setting of maintaining a temperature of the processing target object within a predetermined temperature range; and forming plasma from a processing gas within the processing vessel and performing an etching processing upon the processing target object by using the plasma, while maintaining the temperature of the processing target object within the predetermined temperature range. The processing target object includes a silicon oxide film and a silicon nitride film. The processing gas includes a first gas and a second gas. The first gas is a fluorocarbon gas. The second gas is a hydrogen-containing gas. The predetermined temperature range is equal to or higher than −30° C. and equal to or less than 30° C. The first gas includes a first fluorocarbon gas to a $p^{th}$ fluorocarbon gas of p kinds of fluorocarbon gases (p is an integer equal to or larger than 1). The second gas includes a first hydrogen-containing gas to a $q^{th}$ hydrogen-containing gas of q kinds of hydrogen-containing gases (q is an integer equal to or larger than 1). A flow rate of an $i^{th}$ fluorocarbon gas, which is included in the first fluorocarbon gas to the $p^{th}$ fluorocarbon gas, during the etching processing is referred to as J(i). A number of fluorine atoms included in an elemental composition of the $i^{th}$ fluorocarbon gas is referred to as M(i). A number of carbon atoms included in the elemental composition of the $i^{th}$ fluorocarbon gas is referred to as N(i). A value calculated by summing J(i)×N(i)/M(i) of all values that i can be is referred to as Ua (i is an integer equal to or larger than 1 and equal to or less than p). A flow rate of a $k^{th}$ hydrogen-containing gas, which is included in the first hydrogen-containing gas to the $q^{th}$ hydrogen-containing gas, during the etching processing is referred to as J(k). A number of hydrogen atoms included in an elemental composition of the $k^{th}$ hydrogen-containing gas is referred to as H(k). A value calculated by summing J(k)×H(k) of all values that k can be is referred to as Ub (k is an integer equal to or larger than 1 and equal to or less than q). Ua/Ub satisfies a condition of 0.04<Ua/Ub<0.22.

So far, researches have been conducted to provide a technique capable of performing etching upon the processing target object having the two kinds of films (the silicon oxide film and the silicon nitride film) at once under a common condition for the films. Such etching may be achieved by setting the temperature of the processing target object to be equal to or higher than −30° C. and equal to or less than 30° C. while setting the flow rate and the elemental composition of the processing gas including the fluorocarbon gas and the hydrogen-containing gas to satisfy a condition of 0.04<Ua/Ub<0.22.

In the exemplary embodiment, the first gas may be one of a $C_4F_8$ gas, a $C_3F_8$ gas and a $C_4F_6$ gas, or a mixed gas composed of at least two of the $C_4F_8$ gas, the $C_3F_8$ gas or the $C_4F_6$ gas. The second gas may be one of a $H_2$ gas and a $CH_4$ gas, or a mixed gas of the $H_2$ gas and the $CH_4$ gas.

In the exemplary embodiment, the processing gas may further include a third gas. The third gas may contain a halogen element other than fluorine. The third gas may be a HBr gas.

In the exemplary embodiment, the processing target object may include a first region, a second region and a mask. The first region and the second region may be arranged along a main surface of the processing target object. Each of the first region and the second region may extend under the main surface. The mask may be provided at the main surface on the first region and the second region and is provided with an opening at each of the first region and the second region. The first region may be made of a first film. The second region may be made of a second film. The first film may be the silicon oxide film. The second film may have a structure in which the silicon oxide film and the silicon nitride film are alternately stacked on top of each other. The first region and the second region may be etched at the same time in the etching processing.

In the exemplary embodiment, the processing target object may further include a third region. The third region may extend under the main surface and may be arranged along this main surface together with the first region and the second region. The mask may be provided at the main surface on the third region and may be provided with an opening at the third region. The third region may be made of the first film and the second film. The first region, the second region and the third region may be etched at the same time in the etching processing.

In the exemplary embodiment, there is provided a plasma processing apparatus configured to perform an etching processing on a processing target object. The plasma processing apparatus includes a processing vessel; a placing table provided within the processing vessel and configured to place the processing target object thereon when the etching processing is performed. The plasma processing apparatus includes a temperature control device configured to adjust a temperature of the processing target object placed on the placing table when the etching processing is performed. The plasma processing apparatus includes a gas supply device configured to supply a processing gas into the processing vessel when the etching processing is performed. The plasma processing apparatus includes a high frequency power supply configured to form plasma from the processing gas in a processing space within the processing vessel when the etching processing is performed. The plasma processing apparatus includes a controller configured to control the temperature control device, the gas supply device and the high frequency power supply. The controller controls the temperature control device, the gas supply device and the high frequency power supply such that the plasma from the processing gas is formed within the processing vessel and the etching processing upon the processing target object is performed by using the plasma while maintaining the temperature of the processing target object placed on the placing table within a predetermined temperature range. The processing gas includes a first gas and a second gas. The first gas is a fluorocarbon gas. The second gas is a hydrogen-containing gas. The predetermined temperature range is equal to or higher than −30° C. and equal to or less than 30° C. The first gas includes a first fluorocarbon gas to a $p^{th}$ fluorocarbon gas of p kinds of fluorocarbon gases (p is an integer equal to or larger than 1). The second gas includes a first hydrogen-containing gas to a $q^{th}$ hydrogen-containing gas of q kinds of hydrogen-containing gases (q is an integer equal to or larger than 1). A flow rate of an $i^{th}$ fluorocarbon gas, which is included in the first fluorocarbon gas to the $p^{th}$ fluorocarbon gas, during the etching processing is referred to as J(i). A number of fluorine atoms included in an elemental composition of the $i^{th}$ fluorocarbon gas is referred to as M(i). A number of carbon atoms included in the elemental composition of the $i^{th}$ fluorocarbon gas is referred to as N(i). A value calculated by summing J(i)×N(i)/M(i) of all values that i can be is referred to as Ua (i is an integer equal to or larger than 1 and equal to or less than p). A flow rate of a $k^{th}$ hydrogen-containing gas, which is included in the first hydrogen-containing gas to the $q^{th}$ hydrogen-containing gas, during the etching processing is referred to as J(k). A number of hydrogen atoms included in an elemental composition of the $k^{th}$ hydrogen-containing gas is referred to as H(k). A value calculated by summing J(k)×H(k) of all values that k can be is referred to as Ub (k is an integer equal to or larger than 1 and equal to or less than q). Ua/Ub satisfies a condition of 0.04<Ua/Ub<0.22.

So far, the researches have been conducted to provide the technique capable of performing the etching upon the processing target object having the two kinds of films (the silicon oxide film and the silicon nitride film) at once under the common condition for the films. Such etching may be achieved by setting the temperature of the processing target object to be equal to or higher than −30° C. and equal to or less than 30° C. while setting the flow rate and the elemental composition of the processing gas including the fluorocarbon gas and the hydrogen-containing gas to satisfy the condition of 0.04<Ua/Ub<0.22.

Below, the various exemplary embodiments will be described in detail with reference to the accompanying drawings. In the various drawings, same or corresponding parts will be assigned same reference numerals.

Figure 1:
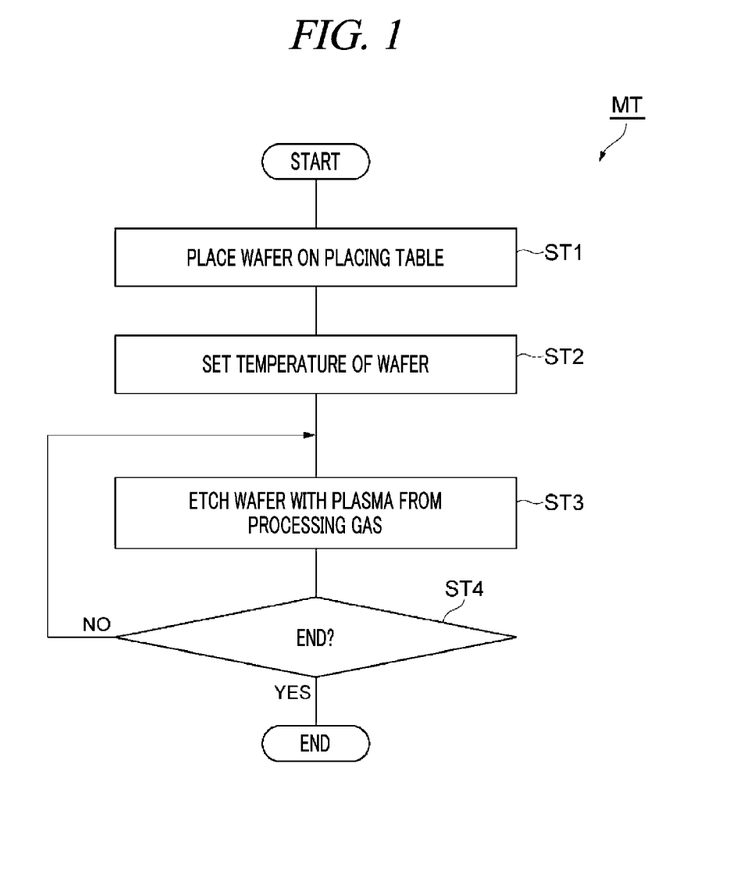
FIG. 1 is a flowchart illustrating an example of a method according to an exemplary embodiment.

FIG. 1 is a flowchart of a method MT according to an exemplary embodiment of an etching method. The method MT may be performed to manufacture, for example, a NAND flash memory having a three-dimensional structure. The method MT is a method of etching a wafer W (processing target object) having a structure shown in FIG. 3, for example, by using a plasma processing apparatus 10 depicted in FIG. 2.

Figure 2:
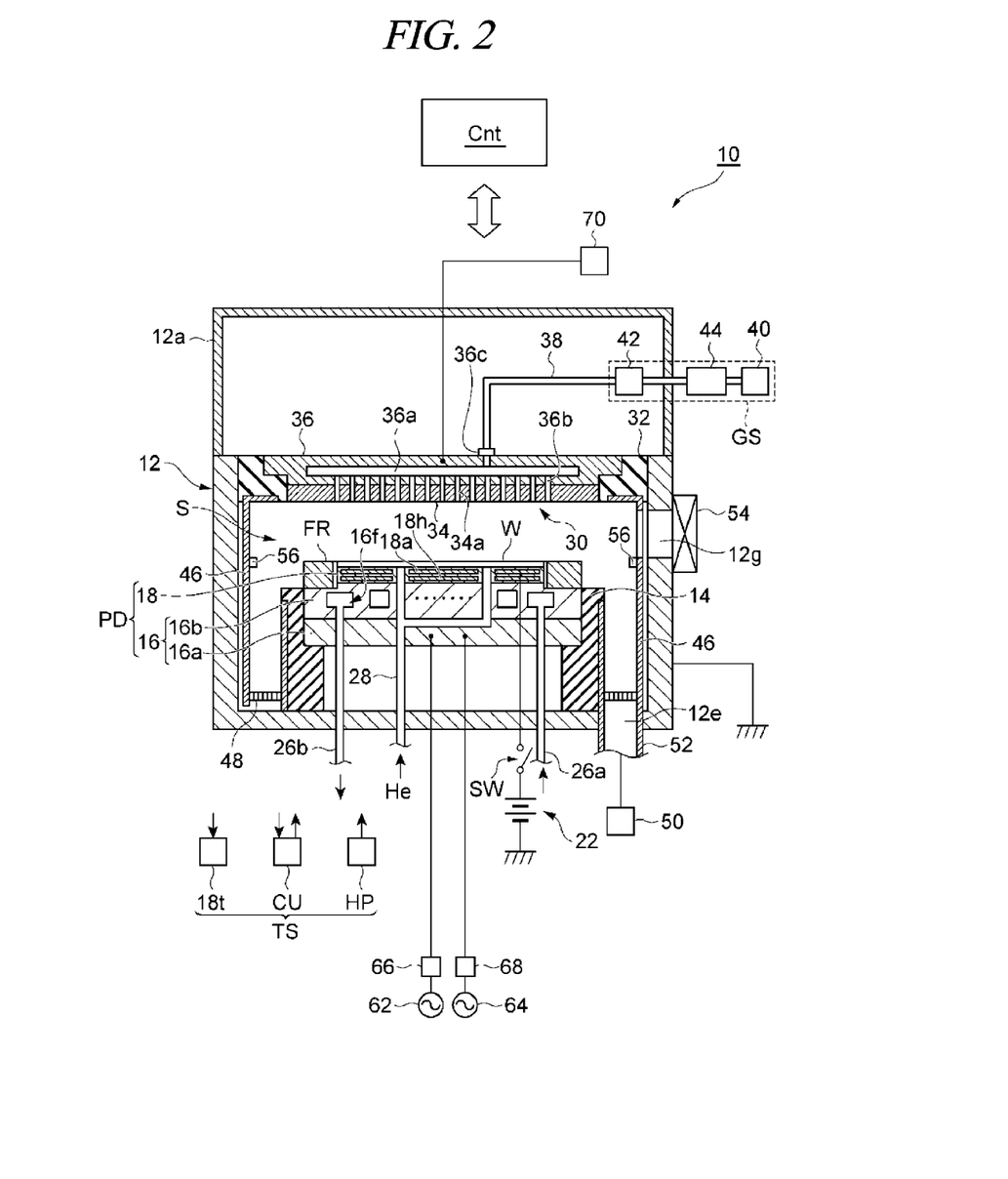
FIG. 2 is a diagram illustrating a configuration of a plasma processing apparatus according to the exemplary embodiment.

FIG. 2 illustrates a configuration of the plasma processing apparatus 10 according to an exemplary embodiment of a plasma processing apparatus. The plasma processing apparatus 10 is configured to perform an etching processing (a processing included in the method MT) upon the wafer W by using plasma.

The plasma processing apparatus 10 shown in FIG. 2 is a capacitively coupled plasma etching apparatus. The plasma processing apparatus 10 is equipped with a substantially cylindrical processing vessel 12. The processing vessel 12 may be made of, by way of example, but not limitation, aluminum. An inner wall surface of the processing vessel 12 is anodically oxidized. The processing vessel 12 is frame-grounded.

A supporting member 14 is provided on a bottom portion of the processing vessel 12. The supporting member 14 has a substantially cylindrical shape and is made of, by way of non-limiting example, an insulating material such as quartz or aluminum oxide. Within the processing vessel 12, the supporting member 14 extends vertically from the bottom portion of the processing vessel 12.

A placing table PD is provided within the processing vessel 12 and configured to place the wafer W thereon when the etching processing (the processing included in the method MT) is performed. The placing table PD is supported by the supporting member 14. The placing table PD includes a lower electrode 16 and an electrostatic chuck 18.

The lower electrode 16 is equipped with a first member 16a and a second member 16b. Each of the first member 16a and the second member 16b may be made of a metal such as, but not limited to, aluminum. Each of the first member 16a and the second member 16b has a substantially disk shape. The second member 16b is provided on the first member 16a and electrically connected with the first member 16a.

The electrostatic chuck 18 is provided on the lower electrode 16. To be specific, the electrostatic chuck 18 is provided on the second member 16b. The electrostatic chuck 18 is configured to hold the wafer W placed on a top surface of the electrostatic chuck 18.

To elaborate, the electrostatic chuck 18 has a substantially disk-shaped insulating film. An electrode 18a is embedded in the insulating film of the electrostatic chuck 18. The electrode 18a is connected to a DC power supply 22 via a switch SW.

The electrostatic chuck 18 generates an electrostatic force such as a Coulomb force when a DC voltage from the DC power supply 22 is applied to the electrode 18a. The electrostatic chuck 18 attracts and holds the wafer W by the generated electrostatic force.

A focus ring FR is provided on a peripheral portion of the lower electrode 16. The focus ring FR has an annular plate shape and is disposed to surround an edge of the wafer W and an edge of the electrostatic chuck 18.

The focus ring FR is made of a material which is appropriately selected depending on a material of an etching target film. For example, the focus ring FR may be made of silicon, silicon carbide (SiC) or quartz.

The plasma processing apparatus 10 is equipped with a temperature control device TS configured to control a temperature of the electrostatic chuck 18. The temperature control device TS controls a temperature of the wafer W when the etching processing (the processing included in the method MT) is performed. The temperature control device TS is equipped with a chiller unit CU, a heater 18h, a heater power supply HP and a temperature detector 18t.

The temperature detector 18t is configured to detect the temperature of the wafer W placed on the placing table PD, and sends a detection result to a controller Cnt. The controller Cnt is configured to control the chiller unit CU and the heater power supply HP based on the detection result received from the temperature detector 18t.

The chiller unit CU is provided at an outside of the processing vessel 12. The chiller unit CU is connected to a pipeline 26a and a pipeline 26b. The pipeline 26a and the pipeline 26b are connected to a path 16f for a fluid. The path 16f is formed within the lower electrode 16.

The chiller unit CU is configured to supply a heat transfer medium into the path 16f via the pipeline 26a. The heat transfer medium supplied into the path 16f is returned back into the chiller unit CU via the pipeline 26b. The heat transfer medium is circulated between the path 16f and the chiller unit CU.

The heater 18h is disposed within the electrostatic chuck 18. The heater 18h is connected to the heater power supply HP. The heater 18h generates heat by a power supplied from the heater power supply HP. Further, if heat input to the placing table PD from plasma is large in the plasma processing, the heater 18h and the heater power supply HP may be omitted.

Further, a gas supply line 28 is provided in the plasma processing apparatus 10 as a part of the temperature control device TS. A heat transfer gas, for example, a He gas from a heat transfer gas supply device is supplied into a gap between the top surface of the electrostatic chuck 18 and a rear surface of the wafer W through the gas supply line 28.

Furthermore, a non-illustrated temperature sensor or thermometer included in the temperature detector 18t may be configured to measure the temperature of the wafer W directly, but not limited thereto. For example, a temperature value of the placing table PD or a temperature value of the heat transfer medium supplied into the path 16f from the chiller unit CU may be used. In the plasma processing, the wafer W is exposed to the plasma, and the temperature of the wafer W is raised by ion irradiation from the plasma or due to light, so that a temperature difference may be generated between the wafer W and the placing table PD or the heat transfer medium. Thus, the temperature of the wafer W may be estimated from temperature difference data estimated from a structure between the wafer W and the placing table PD (or the heat transfer medium) and a processing condition, or may be estimated from previously measured temperature difference data.

An upper electrode 30 is disposed above the placing table PD, facing the placing table PD. Formed between the upper electrode 30 and the placing table PD is a processing space S in which the plasma processing is performed on the wafer W.

The upper electrode 30 is supported at an upper portion of the processing vessel 12 with an insulating shield member 32 therebetween. The upper electrode 30 may include an ceiling plate 34 and a supporting body 36.

The ceiling plate 34 is in direct contact with the processing space S. The ceiling plate 34 is provided with multiple gas discharge holes 34a. The ceiling plate 34 may be made of a low-resistance conductor or semiconductor having a relatively low Joule heat.

The supporting body 36 is configured to support the ceiling plate 34 in a detachable manner. The supporting body 36 may be made of a conductive material such as, but not limited to, aluminum. The supporting body 36 may have a water-cooling structure.

The plasma processing apparatus 10 is equipped with a gas supply device GS. The gas supply device GS is configured to supply a processing gas (hereinafter, sometimes referred to as "processing gas G") into the processing vessel 12 when the etching processing (a process ST3 to be described later) included in the method MT is performed.

The processing gas G includes a first gas, a second gas and a third gas. A gas source group 40 includes a plurality of gas sources respectively corresponding to the first gas, the second gas and the third gas.

The first gas is a fluorocarbon gas. The first gas includes a first fluorocarbon gas to a $p^{th}$ fluorocarbon gas of p kinds of fluorocarbon gases (p is an integer equal to or larger than 1). The second gas is a hydrogen-containing gas. The second gas includes a first hydrogen-containing gas to a $q^{th}$ hydrogen-containing gas of q kinds of hydrogen-containing gases (q is an integer equal to or larger than 1). The third gas contains a halogen element other than fluorine.

To elaborate, the first gas is, for example, one of a $C_4F_8$ gas, a $C_3F_8$ gas and a $C_4F_6$ gas (when p=1) or a mixed gas composed of at least two of the $C_4F_8$ gas, the $C_3F_8$ gas and the $C_4F_6$ gas (when p=2 or 3). The second gas may be, by way of example, a $H_2$ gas (when q=1) or a mixed gas of the $H_2$ gas and a $CH_4$ gas (when q=2). The third gas may be a HBr gas.

The gas supply device GS includes the gas source group 40, a valve group 42 and a flow rate controller group 44. The gas source group 40 is connected to a gas supply line 38 via the valve group 42 and the flow rate controller group 44. The gas source group 40 supplies the processing gas G into the processing space S when the etching processing (the processing included in the method MT) is performed.

The valve group 42 includes a plurality of valves, and the flow rate controller group 44 includes a plurality of flow rate controllers such as mass flow controllers. Each of the gas sources belonging to the gas source group 40 is connected to the gas supply line 38 via a corresponding flow rate controller belonging to the flow rate controller group 44 and a corresponding valve belonging to the valve group 42.

A gas diffusion space 36a is formed within the supporting body 36. Multiple gas through holes 36b extend downwards from the gas diffusion space 36a. These gas through holes 36b respectively communicate with the gas discharge holes 34a.

A gas inlet opening 36c is formed at the supporting body 36. The processing gas G is introduced into the gas diffusion space 36a through the gas inlet opening 36c. The gas supply line 38 is connected to this gas inlet opening 36c.

A grounding conductor 12a has a substantially cylindrical shape. The grounding conductor 12a extends upwards from a sidewall of the processing vessel 12 to be higher than a height position of the upper electrode 30.

A deposition shield 46 is provided along an inner wall of the processing vessel 12 in a detachable manner. This deposition shield 46 is also provided on an outer side surface of the supporting member 14.

The deposition shield 46 suppresses an etching byproduct from adhering to the processing vessel 12. The deposition shield 46 may be made of, by way of non-limiting example, an aluminum member coated with ceramics such as $Y_2O_3$.

A gas exhaust plate 48 is provided between the supporting member 14 and the inner wall of the processing vessel 12. The gas exhaust plate 48 is provided with a plurality of through holes in a plate thickness direction thereof. The gas exhaust plate 48 may be made of, by way of example, an aluminum member coated with ceramics such as $Y_2O_3$.

A gas exhaust port 12e is provided at the processing vessel 12 under the gas exhaust plate 48. This gas exhaust port 12e is connected to a gas exhaust device 50 via a gas exhaust line 52.

The gas exhaust device 50 has a pressure control valve and a vacuum pump such as a turbo molecular pump. The gas exhaust device 50 is capable of decompressing the processing vessel 12 to a required vacuum level.

An opening 12g is provided at a sidewall of the processing vessel 12 to allow the wafer W to be carried into or out from the processing vessel 12 therethrough. The opening 12g is opened or closed by a gate valve 54.

A conductive member 56 is provided at the inner wall of the processing vessel 12. The conductive member 56 is fixed to the inner wall of the processing vessel 12 to be located substantially on a level with the wafer W. The conductive member 56 is DC-connected to the ground and has an effect of suppressing an abnormal discharge. A location of the conductive member 56 is not limited to the example shown in FIG. 2 as long as the conductive member 56 is provided in a plasma formation region.

A first high frequency power supply 62 is configured to generate a first high frequency power for plasma formation. The first high frequency power supply 62 forms plasma from the processing gas by the first high frequency power in the processing space S within the processing vessel 12 when the etching processing (the processing included in the method MT) is performed. The first high frequency power may have a frequency ranging from 27 MHz to 100 MHZ, for example, 40 MHz. The first high frequency power supply 62 is connected to the lower electrode 16 via a matching device 66.

The matching device 66 is equipped with a circuit configured to match an output impedance of the first high frequency power supply 62 and an input impedance at a load side (lower electrode 16 side). The first high frequency power supply 62 may be connected to the upper electrode 30 via the matching device 66.

A second high frequency power supply 64 is configured to generate a second high frequency power for ion attraction into the wafer W, that is, a high frequency bias power. A frequency of the second high frequency power may range from 400 kHz to 13.56 MHz, for example, 3 MHz. The second high frequency power supply 64 is connected to the lower electrode 16 via a matching device 68. The matching device 68 is equipped with a circuit configured to match an output impedance of the second high frequency power supply 64 and the input impedance at the load side (lower electrode 16 side).

A DC power supply 70 is connected to the upper electrode 30. The DC power supply 70 is configured to generate a negative DC voltage to apply the generated negative DC voltage to the upper electrode 30.

The controller Cnt is a computer including a processor, a storage, an input device, a display device, and so forth, and controls the individual components of the plasma processing apparatus 10 in an overall manner. Particularly, the controller Cnt controls the temperature control device TS, the gas supply device GS and the first high frequency power supply 62. A computer program is stored in the storage of the controller Cnt. This computer program includes a control program for controlling various processings performed in the plasma processing apparatus 10 by the processor, particularly, a program (processing recipe) for allowing the processor to control the individual components of the plasma processing apparatus 10 to perform the processings according to the processing condition.

The controller Cnt controls the individual components of the plasma processing apparatus 10 in individual processes of the method MT according to the processing recipe of the method MT. To be more specific, the controller Cnt forms the plasma from the processing gas G in the processing space S of the processing vessel 12 while maintaining the temperature of the wafer W placed on the placing table PD within the predetermined temperature range. The controller Cnt controls the temperature control device TS, the gas supply device GS and the first high frequency power supply 62 such that the etching processing (the processing included in the method MT) upon the wafer W is performed by using the formed plasma.

Figure 3:
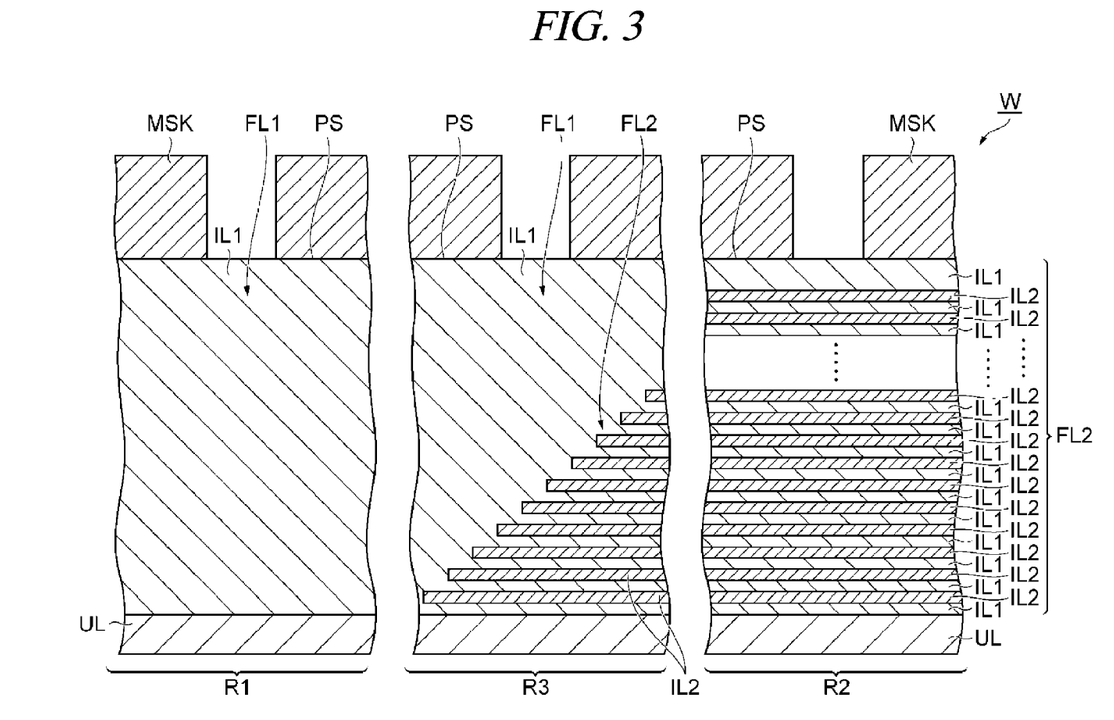
FIG. 3 is a diagram illustrating an example structure of a processing target object which can be processed by the method shown in FIG. 1.

FIG. 3 illustrates a structure of a wafer W according to an exemplary embodiment of the processing target object. The wafer W has an underlying layer UL, a first region R1, a second region R2, a third region R3 and a mask MSK. The underlying layer UL may be, by way of example, a polycrystalline silicon layer provided on a substrate. The first region R1, the second region R2, the third region R3 are provided on the underlying layer UL.

The first region R1, the second region R2 and the third region R3 are arranged along a main surface PS of the wafer W. Each of the first region R1, the second region R2 and the third region R3 extends under the main surface PS.

The first region R1 is made of a first film FL1. The second region R2 is made of a second film FL2. The third region R3 is made of the first film FL1 and the second film FL2. The first film FL1 is a silicon oxide film IL1. The second film FL2 has a structure in which the silicon oxide film IL1 and a silicon nitride film IL2 are alternately stacked on top of each other.

The mask MSK is provided at the main surface PS on the first region R1, the second region R2 and the third region R3. The mask MSK provides an opening at each of the first region R1, the second region R2 and the third region R3. The mask MSK may be made of, byway of non-limiting example, amorphous carbon. Alternatively, the mask MSK may be made of organic polymer.

The method MT shown in FIG. 1 will be discussed. The method MT may be performed in the plasma processing apparatus 10 under the control of the controller Cnt. The method MT includes a process ST1 to a process ST4. First, in the process ST1, the wafer W is placed on the placing table PD (process ST1).

In a process ST2 following the process ST1, setting of maintaining the temperature of the wafer W within the predetermined temperature range (hereinafter, referred to as "temperature range TE") is performed (process ST2). In a process ST3 following the process ST2, while maintaining the temperature of the wafer W within the temperature range TE, the plasma from the processing gas G is formed within the processing space S of the processing vessel 12, and the etching processing upon the wafer W is performed by using this plasma under a processing condition PP to be described later (process ST3). The first region R1, the second region R2 and the third region R3 are etched at the same time by this etching processing of the process ST3.

In the process ST4 following the process ST3, it is determined whether or not to end the method MT (process ST4). To be more specific, in the process ST4, it is determined whether the etching processing is completed to an etching depth previously set in the process ST3 (which corresponds to the determination upon whether or not to end the method MT). The etching depth may be calculated by an etching rate and a processing time, or may be an end point detection result using EPD (End Point Detector). The previously set etching depth may be stored in the storage of the controller Cnt.

If it is determined in the process ST4 that the method MT would not be ended (process ST4: NO), the process ST3 is performed continuously. On the other hand, if it is determined in the process ST4 that the method MT is to be ended (process ST4: YES), the method MT is ended.

Figure 4:
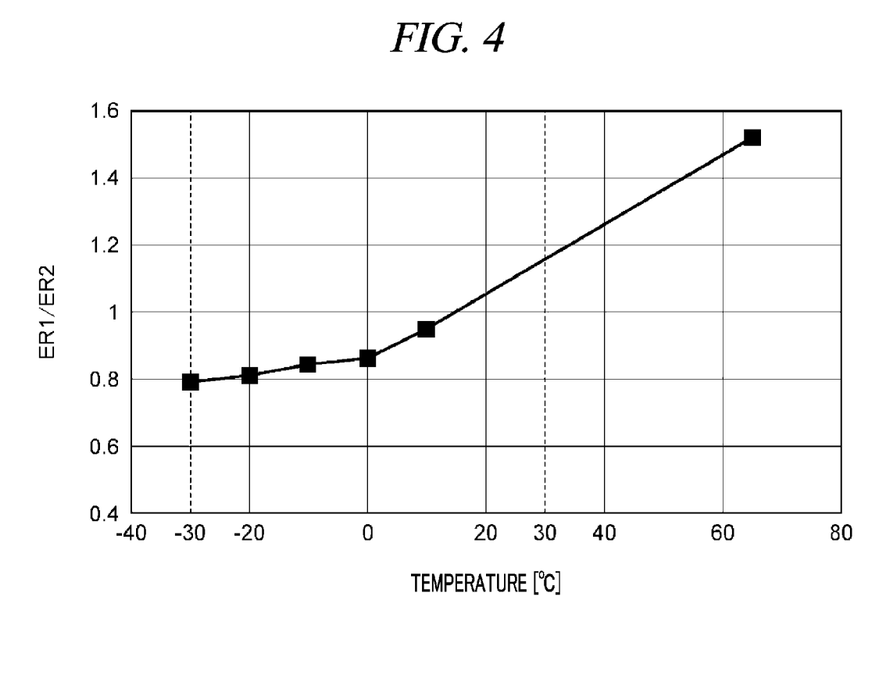
FIG. 4 is a diagram for describing a temperature range in the method shown in FIG. 1.

Referring to FIG. 4, the temperature range TE will be explained. FIG. 4 shows an example of a correlation between a temperature (° C.) of the wafer W and an etching rate ratio between the first film FL1 and the second film FL2 in the etching processing of the method MT. A horizontal axis of FIG. 4 indicates the temperature (° C.) of the wafer W, and a vertical axis of FIG. 4 represents a ratio ER1/ER2 of an etching rate ER1 (nm/min) of the first film FL1 with respect to an etching rate ER2 (nm/min) of the second film FL2. The ratio ER1/ER2 indicates a value of a quotient obtained by dividing a value of ER1 by a value of ER2.

If the temperature of the wafer W is equal to or higher than −30° C. and equal to or less than 30° C., the ratio ER1/ER2 may be a value within a range from 0.8 to 1.2 including a case where ER1/ER2 is 1 (ER1=ER2). Accordingly, the range equal to or higher than −30° C. and equal to or less than 30° C. may be adopted as the temperature range TE for achieving the condition of ER1=ER2.

Results shown in FIG. 4 and FIG. 5 to FIG. 7 to be described later are obtained under the processing conditions PP including the following conditions Pa. Further, although the processing condition PP may be used to perform the process ST3 (etching processing), the contents of the conditions Pa in the processing conditions PP in the process ST3 are not limited to the following.

(Conditions Pa)
Pressure within the processing vessel 12: 15 mTorr to 30 mTorr
Frequency and power of first high frequency power supply 62: 40 MHz, 2 kW to 5 kW
Frequency and power of second high frequency power supply 64: 3 MHz, 7 kW to 9 kW
DC voltage of DC power supply 70: 0 V The result shown in FIG. 4 is obtained by performing the etching processing (process ST3) under the processing conditions PP further including the following condition regarding a flow rate of the processing gas G in addition to the conditions Pa. A $C_4F_8$ gas is used as the first gas (p=1). A $H_2$ gas is used as the second gas (q=1). An in equation IEQ according to the processing gas G to be described later is satisfied.

Flow rate of processing gas G: ($C_4F_8$ gas) 50 sccm, ($H_2$ gas) 160 sccm, (HBr gas) 20 sccm The processing gas G may further include an $O_2$ gas. A flow rate of the $O_2$ gas may be determined based on a required shape of the mask MSK for use in the etching processing of the process ST3.

In the processing conditions PP which is used in the etching processing of the process ST3 and includes the conditions Pa, the condition according to the processing gas G may be used to satisfy 0.04<Ua/Ub<0.22 (hereinafter, sometimes referred to as "inequation IEQ"). Here, Ua/Ub indicates a value of a quotient obtained by dividing a value of Ua by a value of Ub. The values of Ua and Ub are defined as follows.

(Regarding the Value of Ua)
A flow rate of an $i^{th}$ fluorocarbon gas, which is included in the first fluorocarbon gas to the $p^{th}$ fluorocarbon gas included in the first gas of the processing gas G, during the etching processing is referred to as J(i) (i is an integer equal to or larger than 1 and equal to or less than p). The number of fluorine atoms included in an elemental composition of the $i^{th}$ fluorocarbon gas is referred to as M(i); and the number of carbon atoms included in the elemental composition of the $i^{th}$ fluorocarbon gas is referred to as N(i). The value of Ua is a value obtained by summing J(i)×N(i)/M(i) of all values that i can be.

(Regarding the Value of Ub)
A flow rate of a $k^{th}$ hydrogen-containing gas, which is included in the first hydrogen-containing gas to the $q^{th}$ hydrogen-containing gas included in the second gas of the processing gas G, during the etching processing is referred to as J(k) (k is an integer equal to or larger than 1 and equal to or less than q). The number of hydrogen atoms included in an elemental composition of the $k^{th}$ hydrogen-containing gas is referred to as H(k). The value of Ub is a value obtained by summing J(k)×H(k) of all values that k can be.

Figure 5:
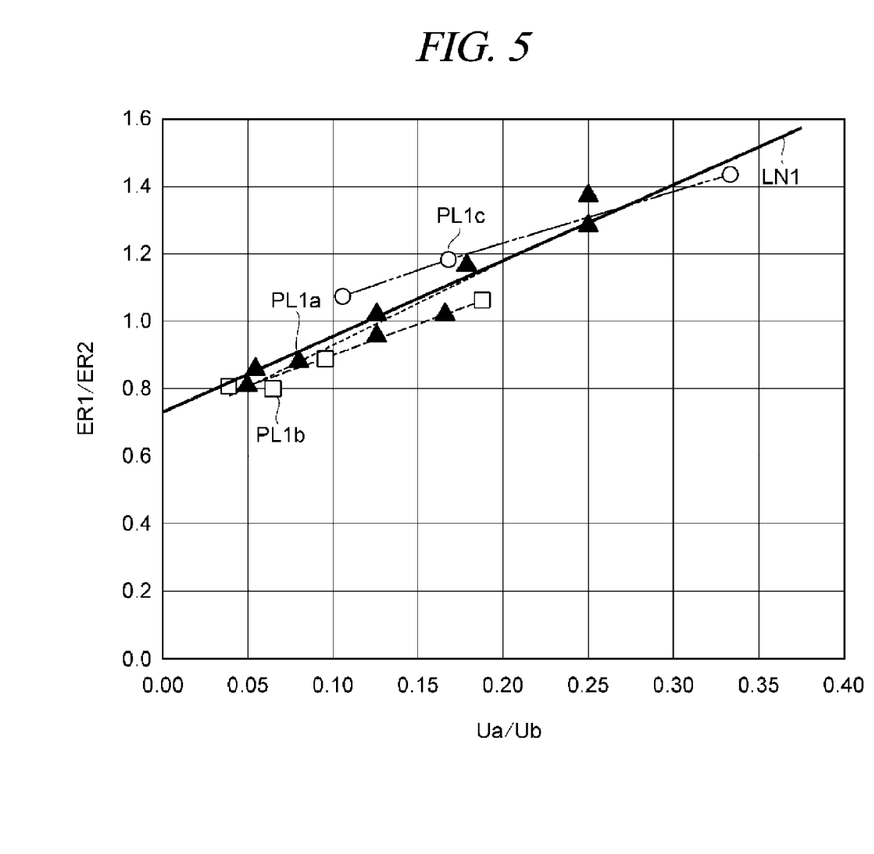
FIG. 5 is a diagram for describing a condition for a processing gas in the method shown in FIG. 1.

The inequation IEQ is adopted based on a result shown in FIG. 5. FIG. 5 shows a result of measuring a correlation between Ua/Ub and ER1/ER2. A horizontal axis of FIG. 5 indicates Ua/Ub, and a vertical axis of FIG. 5 indicates ER1/ER2.

The result shown in FIG. 5 is obtained by performing the etching processing (process ST3) under the processing conditions PP further including the following condition regarding the flow rate of the processing gas G in addition to the conditions Pa. Three kinds of fluorocarbon gases (a $C_4F_8$ gas, a $C_3F_8$ gas and a $C_4F_6$ gas) are used as the first gas individually for each etching processing (p=1). A $H_2$ gas is used as the second gas (q=1). The temperature of the wafer W is about 0° C., satisfying the temperature range TE.

Flow rate of processing gas G: (First gas) 30 sccm to 80 sccm, ($H_2$ gas) 50 sccm to 240 sccm, (HBr gas) 20 sccm The processing gas G may further include an $O_2$ gas. A flow rate of the $O_2$ gas may be decided based on a required shape of the mask MSK in the etching processing.

Multiple measurement results PL1a are marked by black triangles in FIG. 5, and these are measurement results obtained when the $C_4F_8$ gas is used as the first gas. Multiple measurement results PL1b are marked by white squares in FIG. 5, and these are measurement results obtained when the $C_3F_8$ gas is used as the first gas. Multiple measurement results PL1c are indicated by white circles in FIG. 5, and these are measurement results obtained when the $C_4F_6$ gas is used as the first gas.

A straight line LN1 is a regression line obtained by using all the measurement results PL1a, PL1b and PL1c shown in FIG. 5. In the exemplary embodiment, the straight line LN1 is a linear function represented by ER1/ER2=2.2943×Ua/Ub+0.7066 calculated by a least-squares method.

A range of Ua/Ub is set by using the straight line LN1 such that the value of ER1/ER2 is in a range from 0.8 to 1.2 including 1 (ER1=ER2). When Ua/Ub satisfies the inequation IEQ, the value of ER1/ER2 falls within the range from 0.8 to 1.2 including the case where it equals to 1. Accordingly, if Ua/Ub satisfies the inequation IEQ in the process ST3 (etching processing) of the method MT, the etching rates of the first film FL1 and the second film FL2 may be same.

Figure 6:
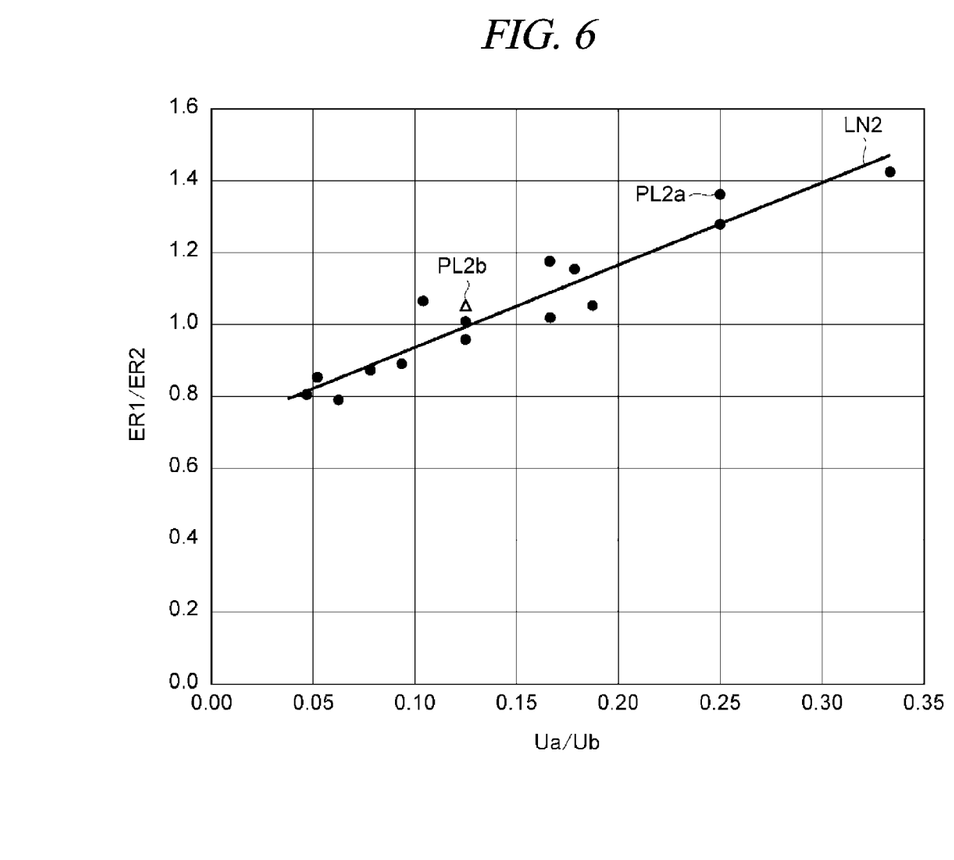
FIG. 6 is a diagram for describing a condition for a second gas of the processing gas in the method shown in FIG. 1.

The second gas included in the processing gas G in the process ST3 of the method MT may include, as the hydrogen-containing gas, for example, a $CH_4$ gas as well as the $H_2$ gas. FIG. 6 shows a result of measuring a correlation between Ua/Ub and ER1/ER2. A horizontal axis of FIG. 6 indicates Ua/Ub, and a vertical axis of FIG. 6 indicates ER1/ER2.

The result shown in FIG. 6 is obtained by performing the etching processing (process ST3) under the processing conditions PP further including the following condition regarding the flow rate of the processing gas G in addition to the conditions Pa. Three kinds of fluorocarbon gases ($C_4F_8$ gas, $C_3F_8$ gas and $C_4F_6$ gas) are used as the first gas individually (p=1). The temperature of the wafer W is about 0° C., satisfying the temperature range TE. The inequation IEQ according to the processing gas G is satisfied.

(When Using the $H_2$ Gas as the Second Gas)
  Flow rate of processing gas G: (First gas) 30 sccm to 80 sccm, ($H_2$ gas) 50 sccm to 240 sccm, (HBr gas) 20 sccm
(When Using a Mixed Gas of the $H_2$ Gas and the $CH_4$ Gas as the Second Gas)
  Flow rate of processing gas G: (First gas) 30 sccm to 80 sccm, ($H_2$ gas) 10 sccm to 30 sccm, ($CH_4$ gas) 50 sccm to 70 sccm, (HBr gas) 10 sccm to 30 sccm The processing gas G may further include an $O_2$ gas. A flow rate of the $O_2$ gas may be decided based on a required shape of the mask MSK in the etching processing.

Multiple measurement results PL2a are marked by black circles in FIG. 6, and these are measurement results obtained when the $H_2$ gas is used as the second gas, and all the measurement results PL1a, PL1b and PL1c shown in FIG. 5 are plotted here. A single measurement result PL2b is marked by a white triangle in FIG. 6, and this is a measurement result obtained when the mixed gas of the $H_2$ gas and the $CH_4$ gas is used as the second gas. Further, a straight line LN2 is a regression line obtained by using the multiple measurement results PL2a shown in FIG. 6, which is the same as the straight line LN1 shown in FIG. 5.

The measurement result PL2b when using the mixed gas of the $H_2$ gas and the $CH_4$ gas as the second gas is plotted near the straight line LN2 which is the regression line obtained by using the measurement result PL2a obtained when using the $H_2$ gas as the second gas. That is, even when the mixed gas of the $H_2$ gas and the $CH_4$ gas is used as the second gas, the value of ER1/ER2 falls within the range from 0.8 to 1.2 including 1 (ER1=ER2) when Ua/Ub satisfies the inequation IEQ. Accordingly, in both cases when the $H_2$ gas is used as the second gas and the mixed gas of the $H_2$ gas and the $CH_4$ gas is used as the second gas in the process ST3, the etching rates of the first film FL1 and the second film FL2 may be same if Ua/Ub satisfies the inequation IEQ.

Figure 7:
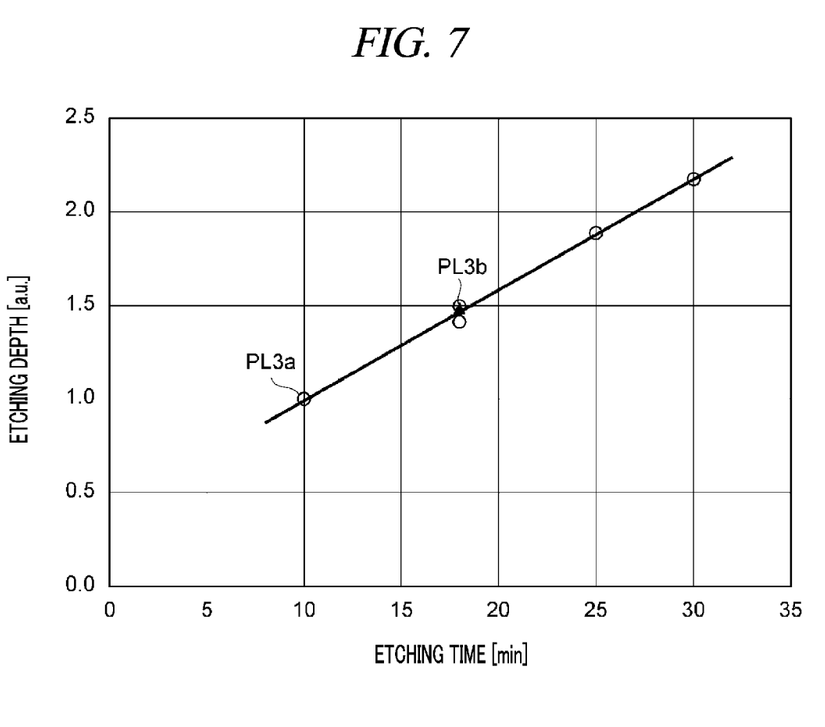
FIG. 7 is a diagram for describing an example of an effect according to the method shown in FIG. 1.

FIG. 7 provides a result of measuring a correlation between an etching time (min) and a standardized etching depth (a.u.) in the etching processing (process ST3) upon the wafer W performed by using the mask MSK provided with two kinds of openings having different opening areas. A horizontal axis of FIG. 7 indicates the etching time (min), and a vertical axis of FIG. 7 indicates the standardized etching depth (a.u.).

The result shown in FIG. 7 is obtained under the processing conditions PP further including the following condition regarding the flow rate of the processing gas G in addition to the conditions Pa. A $C_4F_8$ gas is used as the first gas (p=1). A $H_2$ gas is used as the second gas (q=1). The temperature of the wafer W is about 0° C., satisfying the temperature range TE. The inequation IEQ according to the processing gas G is satisfied.

Flow rate of processing gas G: ($C_4F_8$ gas) 70 sccm, ($H_2$ gas) 140 sccm, (HBr gas) 20 sccm An $O_2$ gas may be further included in the processing gas G.

Multiple measurement results PL3a are indicated by white circles in FIG. 7, and these are measurement result obtained by the etching processing performed on the second film FL2 through an opening of the mask MSK having a first opening area. A single measurement result PL3b is indicated by a black triangle in FIG. 7, and this is a measurement result obtained by the etching processing performed on the second film FL2 through an opening of the mask MSK having a second opening area. The first opening area and the second opening area are different. In FIG. 7, among the multiple measurement results PL3a, an etching depth when the etching time is 10 min is standardized to 1, and each of the multiple measurement results PL3a is plotted based on this.

As can be seen from the result shown in FIG. 7, a correlation between the etching time and the etching depth in the etching processing performed through the opening of the mask MSK having the first opening area and a correlation between the etching time and the etching depth in the etching processing performed through the opening of the mask MSK having the second opening area are equivalent. Thus, as can be seen from this result, according to the process ST3 (etching processing) of the method MT, the substantially same etching rate can be achieved even when the etching processing upon the second film FL2 is performed through the openings of the mask MSK having various different opening areas. Further, according to the multiple measurement results PL3a, the etching depth increases linearly with an increase of the etching time. As can be seen from this, the etching, which is not dependent on an aspect ratio, can be carried out.

According to the exemplary embodiment, it is possible to provide a technique capable of performing the etching upon the processing target object including the two kinds of films (the silicon oxide film and the silicon nitride film) at once under the common conditions for the films.

So far, the various exemplary embodiments have been described. However, the exemplary embodiments are not limiting, and various omissions, substitutions and changes may be made. Further, other exemplary embodiments may be embodied by combining elements in the various exemplary embodiments in a variety of other forms.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An etching method of etching a processing target object, comprising:
   placing the processing target object on a placing table provided within a processing vessel of a plasma processing apparatus;
   performing a setting of maintaining a temperature of the processing target object within a predetermined temperature range; and
   forming plasma from a processing gas within the processing vessel and performing an etching processing upon the processing target object by using the plasma, while maintaining the temperature of the processing target object within the predetermined temperature range,
   wherein the processing target object includes a silicon oxide film and a silicon nitride film,
   the processing gas includes a first gas and a second gas,
   the first gas is a fluorocarbon gas,
   the second gas is a hydrogen-containing gas,
   the predetermined temperature range is equal to or higher than −30° C. and equal to or less than 30° C.,
   the first gas includes a first fluorocarbon gas to a $p^{th}$ fluorocarbon gas of p kinds of fluorocarbon gases (p is an integer equal to or larger than 1), the second gas includes a first hydrogen-containing gas to a $q^{th}$ hydrogen-containing gas of q kinds of hydrogen-containing gases (q is an integer equal to or larger than 1), and when a flow rate of an $i^{th}$ fluorocarbon gas, which is included in the first fluorocarbon gas to the $p^{th}$ fluorocarbon gas, during the etching processing is referred to as J(i); a number of fluorine atoms included in an elemental composition of the $i^{th}$ fluorocarbon gas is referred to as M(i); a number of carbon atoms included in the elemental composition of the $i^{th}$ fluorocarbon gas is referred to as N(i); a value calculated by summing J(i)×N(i)/M(i) of all values that i can be is referred to as Ua (i is an integer equal to or larger than 1 and equal to or less than p); a flow rate of a $k^{th}$ hydrogen-containing gas, which is included in the first hydrogen-containing gas to the $q^{th}$ hydrogen-containing gas, during the etching processing is referred to as J(k); a number of hydrogen atoms included in an elemental composition of the $k^{th}$ hydrogen-containing gas is referred to as H(k); and a value calculated by summing J(k)×H(k) of all values that k can be is referred to as Ub (k is an integer equal to or larger than 1 and equal to or less than q), Ua/Ub satisfies a condition of 0.04<Ua/Ub<0.22, wherein the second gas is one of a $H_2$ gas and a $CH_4$ gas, or a mixed gas of the $H_2$ gas and the $CH_4$ gas.

2. The etching method claim 1,
wherein the first gas is one of a $C_4F_8$ gas, a $C_3F_8$ gas and a $C_4F_6$ gas, or a mixed gas composed of at least two of the $C_4F_8$ gas, the $C_3F_8$ gas or the $C_4F_6$ gas.

3. The etching method of claim 2,
wherein the processing gas further includes a third gas, and
the third gas contains a halogen element other than fluorine.

4. The etching method of claim 3,
wherein the third gas is a HBr gas.

5. The etching method of claim 4,
wherein the processing target object includes a first region, a second region and a mask,
the first region and the second region are arranged along a main surface of the processing target object,
each of the first region and the second region extends under the main surface,
the mask is provided at the main surface on the first region and the second region and is provided with an opening at each of the first region and the second region,
the first region is made of a first film,
the second region is made of a second film,
the first film is the silicon oxide film,
the second film has a structure in which the silicon oxide film and the silicon nitride film are alternately stacked on top of each other, and
the first region and the second region are etched at the same time in the etching processing.

6. The etching method of claim 5,
wherein the processing target object further includes a third region,
the third region extends under the main surface and is arranged along this main surface together with the first region and the second region,
the mask is provided at the main surface on the third region and is provided with an opening at the third region,
the third region is made of the first film and the second film, and the first region, the second region and the third region are etched at the same time in the etching processing.

7. The etching method of claim 1,
wherein the processing gas further includes an $O_2$ gas.

8. The etching method of claim 1,
wherein the processing gas further includes a third gas, and
the third gas contains a halogen element other than fluorine.

9. The etching method of claim 8,
wherein the third gas is a HBr gas.

10. An etching method of etching a processing target object, comprising:
placing the processing target object on a placing table provided within a processing vessel of a plasma processing apparatus;
performing a setting of maintaining a temperature of the processing target object within a predetermined temperature range; and
forming plasma from a processing gas within the processing vessel and performing an etching processing upon the processing target object by using the plasma, while maintaining the temperature of the processing target object within the predetermined temperature range, wherein the processing target object includes a silicon oxide film and a silicon nitride film,
the processing gas includes a first gas and a second gas,
the first gas is a fluorocarbon gas,
the second gas is a hydrogen-containing gas,
the predetermined temperature range is equal to or higher than −30° C. and equal to or less than 30° C.,
the first gas includes a first fluorocarbon gas to a $p^{th}$ fluorocarbon gas of p kinds of fluorocarbon gases (p is an integer equal to or larger than 1),
the second gas includes a first hydrogen-containing gas to a $q^{th}$ hydrogen-containing gas of q kinds of hydrogen-containing gases (q is an integer equal to or larger than 1), and
when a flow rate of an $i^{th}$ fluorocarbon gas, which is included in the first fluorocarbon gas to the $p^{th}$ fluorocarbon gas, during the etching processing is referred to as J(i), a number of fluorine atoms included in an elemental composition of the $i^{th}$ fluorocarbon gas is referred to as M(i), a number of carbon atoms included in the elemental composition of the $i^{th}$ fluorocarbon gas is referred to as NO, a value calculated by summing J(i)×N(i)/M(i) of all values that i can be is referred to as Ua (i is an integer equal to or larger than 1 and equal to or less than p); a flow rate of a $k^{th}$ hydrogen-containing gas, which is included in the first hydrogen-containing gas to the $q^{th}$ hydrogen-containing gas, during the etching processing is referred to as J(k), a number of hydrogen atoms included in an elemental composition of the $k^{th}$ hydrogen-containing gas is referred to as H(k), and a value calculated by summing J(k)×H(k) of all values that k can be is referred to as Ub (k is an integer equal to or larger than 1 and equal to or less than q), Ua/Ub satisfies a condition of 0.04<Ua/Ub<0.22, wherein the processing target object includes a first region, a second region and a mask,
the first region and the second region are arranged along a main surface of the processing target object,
each of the first region and the second region extends under the main surface, the mask is provided at the main surface on the first region and the second region and is provided with an opening at each of the first region and the second region, the first region is made of a first film, the second region is made of a second film, the first film is the silicon oxide film, the second film has a structure in which the silicon oxide film and the silicon nitride film are alternately stacked on top of each other, and the first region and the second region are etched at the same time in the etching processing.

11. The etching method of claim 10, wherein the processing target object further includes a third region, the third region extends under the main surface and is arranged along this main surface together with the first region and the second region, the mask is provided at the main surface on the third region and is provided with an opening at the third region, the third region is made of the first film and the second film, and the first region, the second region and the third region are etched at the same time in the etching processing.

\* \* \* \* \*

UNITED STATES PATENT AND TRADEMARK OFFICE
CERTIFICATE OF CORRECTION

PATENT NO. : 11,251,049 B2
APPLICATION NO. : 16/840585
DATED : February 15, 2022
INVENTOR(S) : Taku Gohira et al.

It is certified that error appears in the above-identified patent and that said Letters Patent is hereby corrected as shown below:

In the Claims

Column 16, Line 48, "NO" should be -- N(i) --.

Signed and Sealed this
Fifteenth Day of November, 2022

Katherine Kelly Vidal
*Director of the United States Patent and Trademark Office*